US012812572B2

(12) United States Patent
Ke et al.

(10) Patent No.: US 12,812,572 B2
(45) Date of Patent: Nov. 24, 2026

(54) ORAN SYSTEM AND METHOD OF TIME SYNCHRONIZATION FOR RU AND DU IN ORAN SYSTEM

(71) Applicant: Alpha Networks Inc., Hsinchu (TW)

(72) Inventors: Tzu-Chung Ke, Hsinchu (TW); Yan-Ciao Jao, Hsinchu (TW)

(73) Assignee: ALPHA NETWORKS INC., Hsinchu (TW)

( * ) Notice: Subject to any disclaimer, the term of this patent is extended or adjusted under 35 U.S.C. 154(b) by 235 days.

(21) Appl. No.: 18/943,038

(22) Filed: Nov. 11, 2024

(65) Prior Publication Data

US 2026/0006565 A1 Jan. 1, 2026

(30) Foreign Application Priority Data

Jun. 27, 2024 (TW) ................................ 113124038

(51) Int. Cl.
*H03B 5/30* (2006.01)
*H04W 56/00* (2009.01)

(52) U.S. Cl.
CPC ............. *H04W 56/001* (2013.01); *H03B 5/30* (2013.01)

(58) Field of Classification Search
CPC ...... H04W 56/001; H03B 5/30; H04J 3/0685; H04B 1/40
See application file for complete search history.

(56) References Cited

U.S. PATENT DOCUMENTS

2022/0123849 A1 4/2022 Mccall et al.
2023/0262281 A1* 8/2023 Kasichainula ..... H04N 21/8547 386/207

FOREIGN PATENT DOCUMENTS

CN 115190577 A 10/2022
CN 120445020 A * 8/2025 ............... G01B 7/16

OTHER PUBLICATIONS

Search Report appended to an Office Action, which was issued to Taiwanese counterpart application No. 113124038 by the TIPO on Mar. 17, 2025, with an English translation thereof (2 pages).

* cited by examiner

*Primary Examiner* — Ayman A Abaza
*Assistant Examiner* — Benjamin T. Ranew
(74) *Attorney, Agent, or Firm* — HSML P.C.

(57) ABSTRACT

An ORAN system includes an RU and a DU. The RU includes a crystal oscillator set with a standard oscillation frequency, and a clock generator using the frequency as a reference to define one second, generating a drive signal and generating clock pulse signals according to the frequency. The RU includes a digital counter, which, upon receiving each clock pulse signal, adds one to a count value, and which receives a PPS signal from a GNSS module every second. Upon receiving the PPS signal, the digital counter reads the count value, determines whether the read count value is equal to a value of the frequency, and resets the count value to zero. If the read count value is not equal to the value of the frequency, the digital counter sends an oscillation frequency adjustment signal to the crystal oscillator for adjusting the crystal oscillator's oscillation frequency.

16 Claims, 4 Drawing Sheets

ORAN SYSTEM AND METHOD OF TIME SYNCHRONIZATION FOR RU AND DU IN ORAN SYSTEM

CROSS-REFERENCE TO RELATED APPLICATION

This application claims priority to Taiwanese Invention Patent Application No. 11/312,4038, filed on Jun. 27, 2024, the entire disclosure of which is incorporated by reference herein.

FIELD

The disclosure relates to a radio access network (RAN) system and a method of time synchronization in the RAN system, and more particularly to an open radio access network (ORAN) system and a method of time synchronization for a radio unit (RU) and a distributed unit (DU) in the ORAN system.

BACKGROUND

A conventional open radio access network (ORAN) consists essentially of a radio unit (RU), a distribution unit (DU), and a central unit (CU). Currently, Precision Time Protocol (PTP) defined by IEEE 1588 is generally used to synchronize timing across various network units in an ORAN system, thereby preventing packet loss or network interruptions.

Referring to FIG. 1, taking a conventional ORAN system having an existing Lower Layer Split (LLS) Type 1 Control Plane (C1) architecture as an example, a DU 91 reads a satellite synchronization signal from a Telecom Grandmaster (T-GM) 90 via a network interface card (NIC) 910 that supports the standard defined by IEEE 1588, by means of periodic requests or polling. Upon receiving the satellite synchronization signal, a High-PHY layer 911 of the DU 91 needs to execute an IEEE 1588 algorithm to estimate time and frequency using network packets. A fronthaul switch 92 for data transmission and routing between the DU 91 and an RU 93 needs to perform network packet latency calculations, while the RU 93 needs to execute another IEEE 1588 algorithm to fine-tune the frequency of its crystal oscillator (e.g., Oven-Controlled Crystal Oscillator, OCXO), in order to ensure accurate time synchronization. The coordinated operation of these components is necessary to ensure clock synchronization between the DU 91 and the RU 93. In addition, the High-PHY layer 911 and a medium access control (MAC) layer 912 of the DU 91 each need to have allocated a separate logical core to individually read the timestamp from the NIC 910 and generate a synchronized network packet, which facilitates the scheduling of tasks under time-synchronized conditions.

Although the aforementioned architecture achieves the purpose of timing and time synchronization, both the T-GM 90 and the fronthaul switch 92 are extremely expensive, and the NIC 910 of the DU 91 must support the IEEE 1588 standard. In other words, all hardware components and software applications within the ORAN system must conform to the IEEE 1588 standard, resulting in high costs and numerous constraints for network products such as small cell base stations.

SUMMARY

Therefore, an object of the disclosure is to provide an open radio access network (ORAN) system that can alleviate at least one of the drawbacks of the prior art.

According to the disclosure, the ORAN system includes a radio unit (RU) and a distributed unit (DU). The RU includes a global navigation satellite system (GNSS) module that generates a pulse per second (PPS) signal every second, a crystal oscillator that is set with a standard oscillation frequency, a clock generator, a digital counter, and a slot tick module.

The clock generator uses the standard oscillation frequency of the crystal oscillator as a reference to define one second, generates a drive signal with a driving frequency based on the definition of one second, and repeatedly generates clock pulse signals with the standard oscillation frequency.

The digital counter receives the clock pulse signals from the clock generator and, in response to receiving each of the clock pulse signals, adds one to a count value. The digital counter receives the PPS signal from the GNSS module every second, and upon receiving the PPS signal, reads the count value, determines whether the count value thus read is equal to the value of the standard oscillation frequency, and resets the count value to zero. In a case where the digital counter determines that the count value thus read is not equal to a value of the standard oscillation frequency, the digital counter sends an oscillation frequency adjustment signal to the crystal oscillator for adjusting the oscillation frequency.

The slot tick module receives the drive signal and sends a slot tick packet at the driving frequency. The distributed unit performs task scheduling in accordance with the slot tick packet.

Another object of the disclosure is to provide the RU of the ORAN system.

Further another object of the disclosure is to provide a method of time synchronization for RU and DU in ORAN system that is performed by the ORAN system described above. The method includes steps of the GNSS module generating a PPS signal every second, the crystal oscillator being set with the standard oscillation frequency, the clock generator defining one second using the standard oscillation frequency of said crystal oscillator as a reference, the clock generator generating, based on the definition of one second, a drive signal with a driving frequency, the clock generator repeatedly generating clock pulse signals with the standard oscillation frequency, and the digital counter receiving the clock pulse signals from the clock generator and, in response to receiving each of the clock pulse signals, adding one to a count value.

The method further includes steps of the digital counter receiving the PPS signal from the GNSS module every second, and upon receiving the PPS signal, reading the count value, determining whether the count value thus read is equal to a value of the standard oscillation frequency, and resetting the count value to zero. In a case where the digital counter determines that the count value thus read is not equal to the value of the standard oscillation frequency, the digital counter sends an oscillation frequency adjustment signal to the crystal oscillator for adjusting the oscillation frequency. The method further includes steps of the slot tick module receiving the drive signal and sending a slot tick packet at the driving frequency, and the distributed unit performing task scheduling in accordance with the slot tick packet.

BRIEF DESCRIPTION OF THE DRAWINGS

Other features and advantages of the disclosure will become apparent in the following detailed description of the embodiment(s) with reference to the accompanying drawings. It is noted that various features may not be drawn to scale.

DETAILED DESCRIPTION

Figure 1:
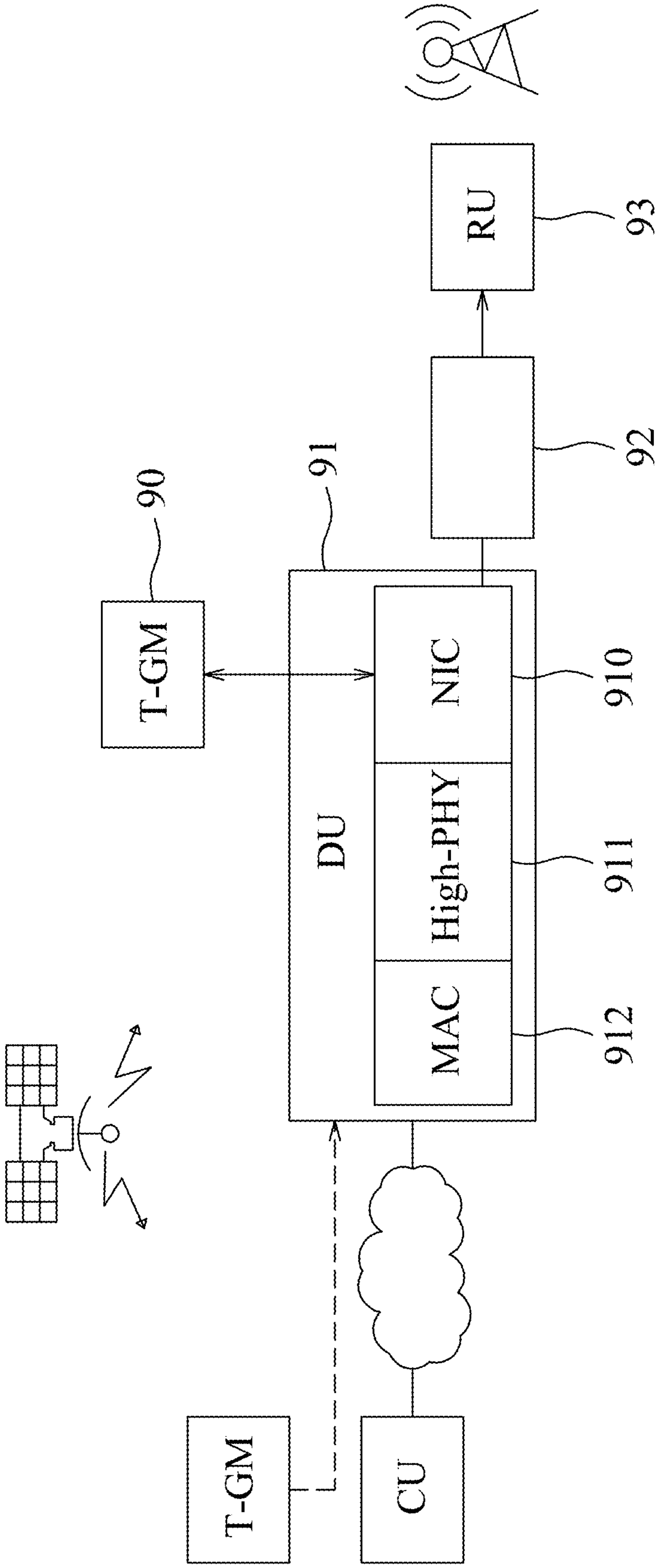
Figure 1 (Prior Art)
FIG. 1 is a block diagram illustrating a conventional open radio access network (ORAN) system that performs synchronization of a distribution unit (DU) and a radio unit (RU) by reading the satellite synchronization signals from a telecom grade master clock (T-GM).

Before the disclosure is described in greater detail, it should be noted that where considered appropriate, reference numerals or terminal portions of reference numerals have been repeated among the figures to indicate corresponding or analogous elements, which may optionally have similar characteristics.

Figure 2:
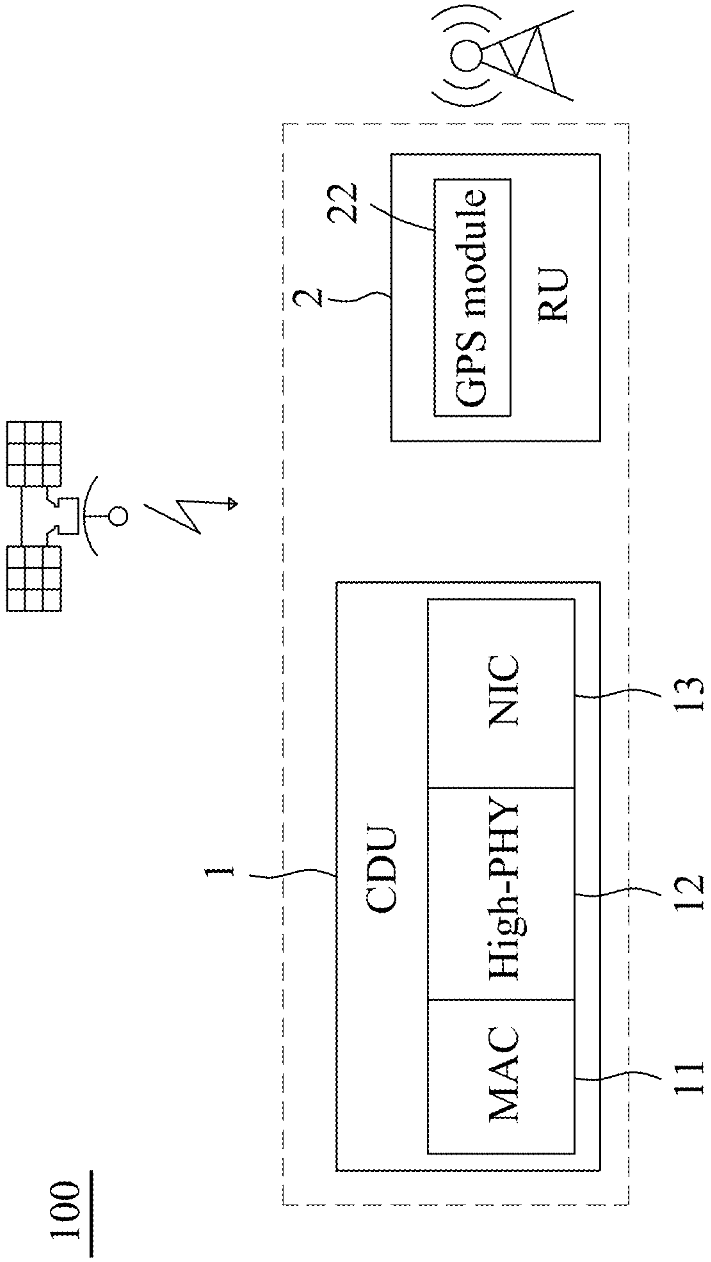
FIG. 2 is a block diagram illustrating an embodiment of an ORAN system according to this disclosure.

Referring to FIG. 2, an embodiment of an ORAN system 100 according to this disclosure includes a radio unit (RU) 2, and a central and distributed unit (CDU) 1 which is an integration of a central unit (CU) and a distributed unit (DU). The CDU 1 and the RU 2 are collectively housed in a box to form a small cell. In some embodiments, the CDU 1 and the RU 2 are located at different locations and transmit data to each other via, for example, an evolved Common Public Radio Interface (eCPRI) over an Ethernet network. In some other embodiments, the CU and the DU are independent devices.

In the present embodiment, the CDU 1 includes a medium access control (MAC) layer 11 for media access control, a high-physical (High-PHY) layer 12, and a network interface card (NIC) 13.

Figure 3:
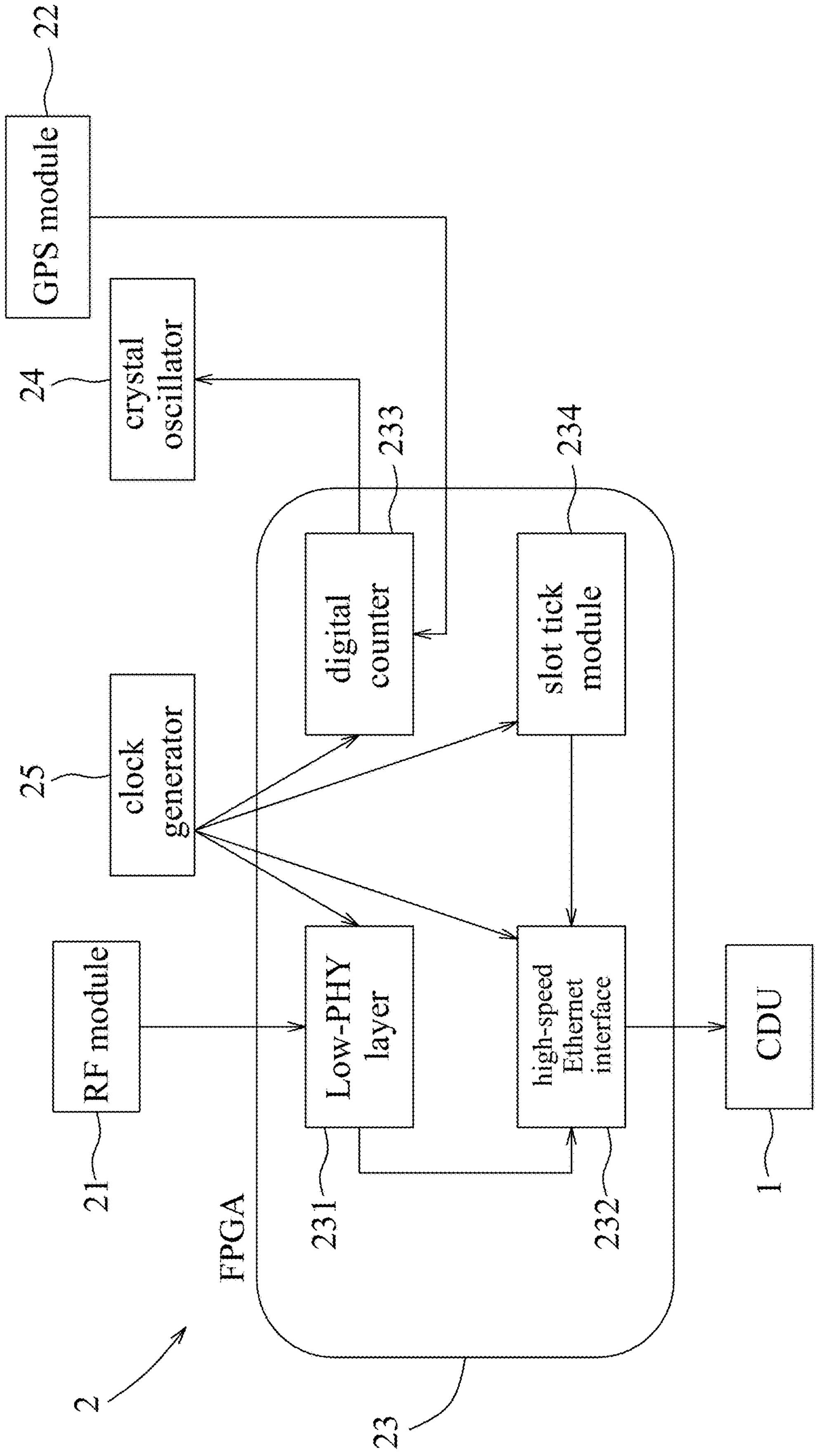
FIG. 3 is a block diagram illustrating an RU of the ORAN system according to an embodiment of this disclosure.

Further referring to FIG. 3, in addition to antennas (not shown) and the radio frequency (RF) module 21 that are normally present in an RU, the RU 2 of the present embodiment further includes a global navigation satellite system (GNSS) module and an FPGA (field programmable gate array) module 23. In this embodiment, the GNSS module is a Global Positioning System (GPS) module 22 that receives GPS satellite signals to serve as an accurate reference clock. In other embodiments, the GNSS module may be a Global Navigation Satellite System (GLONASS) module, a Galileo module, a BeiDou module, or a Navigation with Indian Constellation (NavIC) module.

The FPGA module 23, which is customized and developed using field programmable gate array (FPGA) technology, includes a low-physical (Low-PHY) layer 231 used to collect in-phase and quadrature data (IQ data) from the RF module 21, a high-speed Ethernet interface 232 receiving the IQ data from the Low-PHY layer 231, a digital counter 233, and a slot tick module 234 used to synchronize time slots using network packets. The high-speed Ethernet interface 232 is, but not limited to, one that complies with 10G Ethernet. In this embodiment, the FPGA technology is used to design and implement the above FPGA module 23. The FPGA technology enables rapid and parallel execution of the designed module functions (as described in further detail below), thereby providing more precise control over timing operations.

According to the present embodiment, the RU 2 further includes a crystal oscillator 24 and a clock generator 25 that are used in coordination with the GPS module 22 and the FPGA module 23 to jointly implement the time synchronization between the CDU 1 and the RU 2 in the ORAN 100. The crystal oscillator 24 may be, for example but is not limited thereto, a voltage-controlled temperature compensated crystal oscillator (VCTCXO), or may be other crystal oscillators such as a voltage-controlled crystal oscillator (VCXO), or an oven-controlled crystal oscillator (OCXO), etc.

Figure 4:
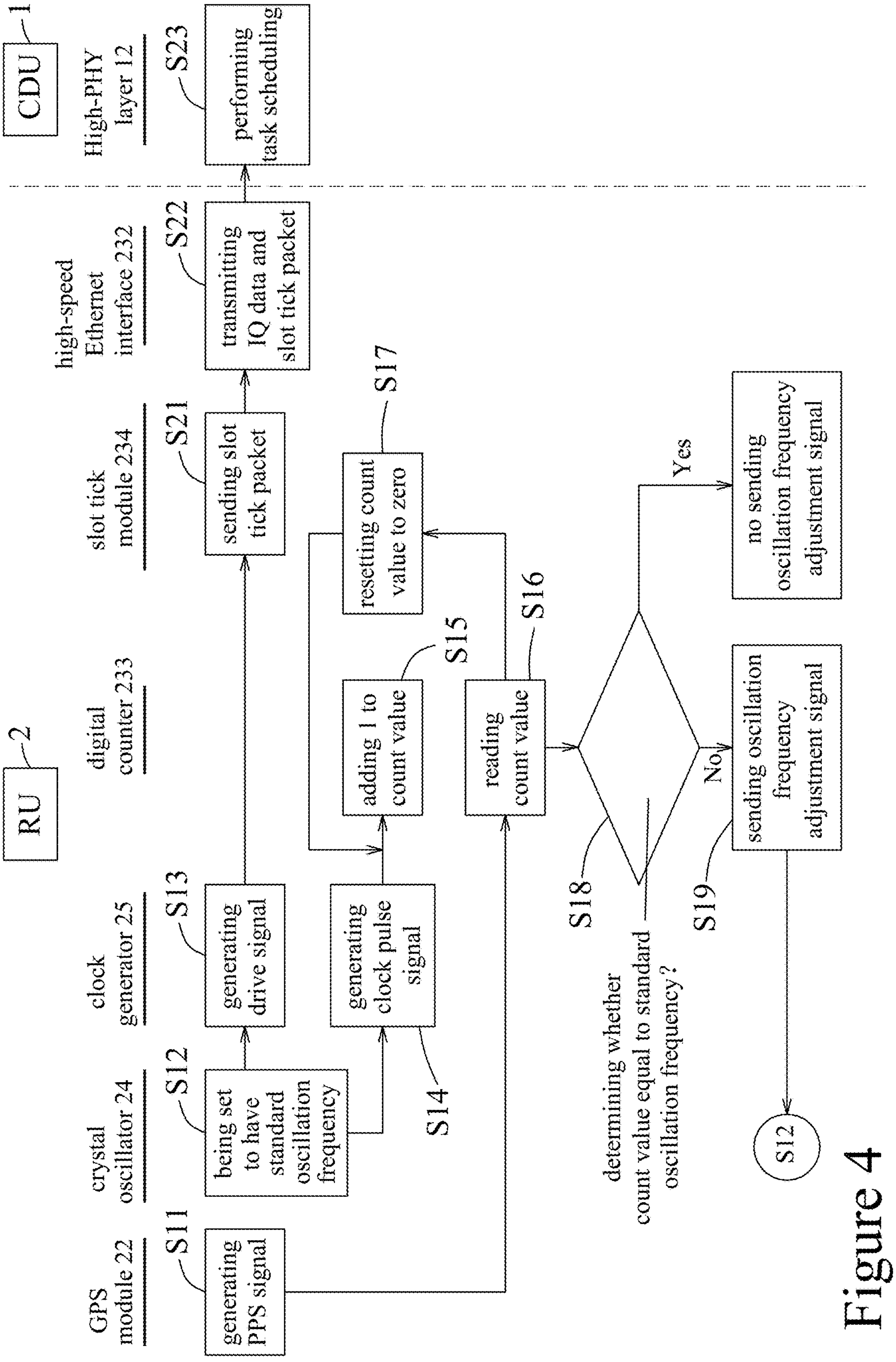
FIG. 4 is a flowchart of a method of time synchronization for an RU and a DU in an ORAN system according to an embodiment of this disclosure.

Referring to FIG. 3 and FIG. 4, the method of time synchronization for an RU and a DU in an ORAN system according to the disclosure mainly uses the GPS module 22 to replace the T-GM 90 of the conventional ORAN system (see FIG. 1) and does not need to comply with the specifications defined by IEEE, and instead, the RU 2 of this disclosure is configured to implement the following process to achieve the time synchronization with the CDU 1.

In step S11, the GPS module 22 generates a pulse per second (PPS) signal every second according to the GPS satellite signals received thereby. Further, the crystal oscillator 24 is set to have a standard oscillation frequency of V Hz (step S12). For illustration purposes, the value V of the standard oscillation frequency is initially preset to $52\times10^6$, but in practice, the value V is not limited to this specific value.

In step S13, the clock generator 25 uses the standard oscillation frequency of the crystal oscillator 24 as a reference to define, in this example, every $52\times10^6$ oscillations as one second. Based on this definition, the clock generator 25 generates a drive signal with a driving frequency of $V_0$ Hz, which serves as a clock reference for the entire ORAN system 100. In this example, $V_0$ is equal to $2^n$, where n is a positive integer. The following example is illustrated with n=2, which means that the driving frequency $V_0$ is equal 4 Hz, i.e., the clock generator 25 generates a drive signal every 0.25 seconds. In other embodiments, $V_0$ may be equal to 2 or 8, etc. In addition, the clock generator 25 repeatedly generates clock pulse signals with the standard oscillation frequency of the crystal oscillator 24 (step S14).

In step S15, the digital counter 233 receives the clock pulse signals from the clock generator 25 and, in response to receiving each of the clock pulse signals, adds one to a count value. Specifically, upon detecting a rising edge of each of the clock pulse signals, the digital counter 233 adds one to the count value. Further, the digital counter 233 receives a PPS signal from the GPS module 22 every second, and upon receiving the PPS signal, the digital counter 233 reads the count value (step S16), determines whether the count value thus read is equal to the value V of the standard oscillation frequency (step S18), and resets the count value to zero (step S17).

When it is determined in step S18 that the count value thus read is not equal to the value V of the standard oscillation frequency, the digital counter 233 sends an oscillation frequency adjustment signal to the crystal oscillator 24 (step S19). Specifically, taking the value V of the standard oscillation frequency being equal to $52\times10^6$ as an example, if the count value thus read is greater than $52\times10^6$, the digital counter 233 sends an oscillation frequency adjustment signal to the crystal oscillator 24 to allow the crystal oscillator 24 to reduce the standard oscillation frequency 52 MHz by, for example, 1 Hz; if the count value thus read is less than $52\times10^6$, the counter 233 sends an oscillation frequency adjustment signal to the crystal oscillator 24 to allow the crystal oscillator 24 to increase the standard oscillation frequency 52 MHz by, for example, 1 Hz; if the value of the count value thus read is equal to $52\times10^6$, the crystal oscillator 24 does not need to be adjusted and the digital counter 233 does not output the oscillation frequency adjustment signal.

When the crystal oscillator 24 receives the oscillation frequency adjustment signal, the crystal oscillator 24 then performs step S12 to set the standard oscillation frequency. For example, the value of the standard oscillation frequency is currently $V_1$, and when the crystal oscillator 24 receives the oscillation frequency adjustment signal, $V_1$ is adjusted to $V_2$, which is different from $V_1$. For example, the value of the standard oscillation frequency $V_1$ is equal to $52\times10^6$, and if the count value read by the digital counter 233 is greater than $52\times10^6$, the crystal oscillator 24 then adjusts the oscillation frequency from $52\times10^6$ to $52\times10^6-1$; if the count value read by the counter 233 is less than $52\times10^6$, the crystal oscillator 24 then adjusts the oscillation frequency from $52\times10^6$ to $52\times10^6+1$. In this way, the clock generator 25 generates the drive signals and the clock pulse signals in accordance with the standard oscillation frequency thus adjusted.

With this mechanism in place, the RU 2 can synchronize with GPS satellite signals. Even if the GPS module 22 fails to receive GPS signals due to adverse weather conditions, the RU 2 can still independently correct the time and maintain accuracy for a certain period.

In step S21, the slot tick module 234 receives the drive signal with $V_0$ Hz and sends a slot tick packet to the high-speed Ethernet interface 232 at the driving frequency $V_0$. The slot tick packet is a network packet that is sent out during each time slot and contains frame slot information that describes, for example, how the time slots are assigned for data transmission or reception. In step S22, the high-speed Ethernet interface 232 transmits, to the CDU 1, the IQ data from the Low-PHY layer 231 and the slot tick packet from the slot tick module 234. Specifically, the NIC 13 receives the IQ data and the slot tick packet from the high-speed Ethernet interface 232 of the RU 2. In step S23, the High-PHY layer 12 of the CDU 1 performs task scheduling in accordance with the slot tick packet. Specifically, the High-PHY layer 12 generates a tick based on the slot tick packet for performing task scheduling.

Regarding the slot tick packet, taking the DDDSU (Downlink, Downlink, Downlink, Special, Uplink) frame structure as an example, there are 20 slots in a frame, and the slots have four cycles; specifically, in every cycle, successive five slots in said cycle are three downlink slots, one pending slot and one uplink slot. The CDU 1 performs uplink and downlink transmissions under precise timing control according to such a structure.

Since the RU 2 has been time synchronized using GPS satellite signals as described above (steps S11 to S19), the clock generator 25 generates the drive signal of $V_0$ Hz based on accurate time for the slot tick module 234 to carry out step S21 to achieve the effect of time synchronization between the RU 2 and the CDU 1.

In summary, under the structure disclosed in the present disclosure, the use of costly Telecom Grandmaster (T-GM) is eliminated. The NIC 13 of the CDU 1 does not need to support IEEE 1588 specifications, and the MAC 11 and the High-PHY layer 12 of the CDU 1 no longer need dedicated logic cores for time synchronization. Instead, the GPS module 22 is integrated into the RU 2, and specific processing is carried out by the digital counter 233 and the clock generator 25 to achieve time synchronization.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects; such does not mean that every one of these features needs to be practiced with the presence of all the other features. In other words, in any described embodiment, when implementation of one or more features or specific details does not affect implementation of another one or more features or specific details, said one or more features may be singled out and practiced alone without said another one or more features or specific details. It should be further noted that one or more features or specific details from one embodiment may be practiced together with one or more features or specific details from another embodiment, where appropriate, in the practice of the disclosure.

While the disclosure has been described in connection with what is(are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. An open radio access network (ORAN) system, comprising:

a radio unit (RU) including a global navigation satellite system (GNSS) module generating a pulse per second (PPS) signal every second, a crystal oscillator being set with a standard oscillation frequency, a clock generator using the standard oscillation frequency of said crystal oscillator as a reference to define one second, generating a drive signal with a driving frequency based on the definition of one second, and repeatedly generating clock pulse signals with the standard oscillation frequency, a digital counter receiving the clock pulse signals from said clock generator and, in response to receiving each of the clock pulse signals, adding one to a count value, said digital counter further receiving the PPS signal from said GNSS module every second, and upon receiving the PPS signal, reading the count value, determining whether the count value thus read is equal to a value of the standard oscillation frequency, and resetting the count value to zero, wherein, in a case where said digital counter determines that the count value thus read is not equal to the value of the standard oscillation frequency, said digital counter sends an oscillation frequency adjustment signal to said crystal oscillator for adjusting the oscillation frequency, and a slot tick module receiving the drive signal and sending a slot tick packet at the driving frequency; and a distributed unit performing task scheduling in accordance with the slot tick packet.

2. The ORAN system as claimed in claim 1, wherein in a case where said digital counter determines that the count value read thereby is greater than the value of the standard oscillation frequency, said digital counter sends the oscillation frequency adjustment signal to said crystal oscillator to reduce the standard oscillation frequency by 1 Hz.

3. The ORAN system as claimed in claim 1, wherein in a case where said digital counter determines that the count value read thereby is less than the value of the standard oscillation frequency, said digital counter sends the oscillation frequency adjustment signal to said crystal oscillator to increase the standard oscillation frequency by 1 Hz.

4. The ORAN system as claimed in claim 1, wherein, upon detecting a rising edge of each of the clock pulse signals, said digital counter adds one to the count value.

5. The ORAN system as claimed in claim 1, wherein said clock generator generates the drive signal with the driving frequency of $V_0$ Hz, where $V_0$ is equal to $2^n$, and n is a positive integer.

6. The ORAN system as claimed in claim 1, wherein said RU further includes a radio frequency (RF) module, and a low-physical (Low-PHY) layer used to collect in-phase and quadrature data (IQ data) from said RF module.

7. The ORAN system as claimed in claim 6, wherein said RU further includes a high-speed Ethernet interface that transmits, to said DU, the IQ data from said Low-PHY layer and the slot tick packet from said slot tick module.

8. The ORAN system as claimed in claim 7, wherein said DU includes:
- a network interface card (NIC) receiving the IQ data and the slot tick packet from said high-speed Ethernet interface of said RU, and
- a high-physical (High-PHY) layer generating a tick based on the slot tick packet for performing task scheduling.

9. A method of time synchronization for RU and DU in ORAN system, performed by an ORAN system as claimed in claim 1, comprising steps of:
- by the GNSS module, generating a pulse per second (PPS) signal every second;
- setting the crystal oscillator to the standard oscillation frequency;
- by the clock generator, defining one second using the standard oscillation frequency of said crystal oscillator as a reference;
- by the clock generator and based on the definition of one second, generating a drive signal with a driving frequency;
- by the clock generator, repeatedly generating clock pulse signals with the standard oscillation frequency,
- by the digital counter, receiving the clock pulse signals from the clock generator and, in response to receiving each of the clock pulse signals, adding one to a count value;
- by the digital counter, receiving the PPS signal from said GNSS module every second, and upon receiving the PPS signal, reading the count value, determining whether the count value thus read is equal to a value of the standard oscillation frequency, and resetting the count value to zero;
- in a case where the digital counter determines that the count value thus read is not equal to the value of the standard oscillation frequency, sending, by the digital counter, an oscillation frequency adjustment signal to said crystal oscillator for adjusting the oscillation frequency;
- by the slot tick module, receiving the drive signal and sending a slot tick packet at the driving frequency; and
- by the distributed unit, performing task scheduling in accordance with the slot tick packet.

10. A radio unit (RU), comprising:
- a global navigation satellite system (GNSS) module generating a pulse per second (PPS) signal every second;
- a crystal oscillator set with a standard oscillation frequency;
- a clock generator using the standard oscillation frequency of said crystal oscillator as a reference to define one second, generating a drive signal with a driving frequency based on the definition of one second, and generating clock pulse signals with the standard oscillation frequency;
- a digital counter receiving the clock pulse signals from said clock generator and, in response to receiving each of the clock pulse signals, adding one to a count value, receiving the PPS signal from said GNSS module every second, and once the PPS signal is received, reading the count value, determining whether the count value thus read is equal to a value of the standard oscillation frequency, and resetting the count value to zero, wherein in a case where said digital counter determines that the count value read thereby is not equal to the value of the standard oscillation frequency, sending an oscillation frequency adjustment signal to said crystal oscillator for adjusting the oscillation frequency; and
- a slot tick module receiving the drive signal and sending a slot tick packet at the driving frequency.

11. The RU as claimed in claim 10, wherein in a case where said digital counter determines that the count value read thereby is greater than the value of the standard oscillation frequency, said digital counter sends the oscillation frequency adjustment signal to said crystal oscillator to lower the standard oscillation frequency by 1 Hz.

12. The RU as claimed in claim 10, wherein in a case where the count value read thereby is less than the value of the standard oscillation frequency, said digital counter sends the oscillation frequency adjustment signal to said crystal oscillator to raise the standard oscillation frequency by 1 Hz.

13. The RU as claimed in claim 10, wherein said digital counter responds to a rising edge of each of the clock pulse signals by adding one to the count value.

14. The RU as claimed in claim 10, wherein said clock generator generates the drive signal with the driving frequency of $V_0$ Hz, wherein $V_0$ is equal to $2^n$, and n is a positive integer.

15. The RU as claimed in claim 10, further comprising a radio frequency (RF) module, and a low-physical (Low-PHY) layer used to collect in-phase and quadrature data (IQ data) from said RF module.

16. The RU as claimed in claim 15, further comprising a high-speed Ethernet interface that transmits, to a DU, the IQ data from said Low-PHY layer and the slot tick packet from said slot tick module.

* * * * *